United States Patent [19]

Shimochi

[11] Patent Number: 4,954,090
[45] Date of Patent: Sep. 4, 1990

[54] ELECTRIC CONNECTION BOX

[75] Inventor: Eiji Shimochi, Shizuoka, Japan

[73] Assignee: Yazaki Corporation, Tokyo, Japan

[21] Appl. No.: 358,227

[22] Filed: May 30, 1989

[30] Foreign Application Priority Data

May 31, 1988 [JP] Japan .............................. 63-131708

[51] Int. Cl.$^5$ .............................................. H01R 9/09
[52] U.S. Cl. ....................................... 439/76; 439/78;
439/81; 439/329; 439/436; 439/721
[58] Field of Search ....................... 439/76–78,
439/80–82, 329, 436, 438, 439, 110, 115, 119,
709, 711, 712, 721, 883, 889

[56] References Cited

U.S. PATENT DOCUMENTS 4,429,943  2/1984  Inoue .................................... 439/721
4,790,760  12/1988  Kreinberg ............................. 439/77

Primary Examiner—Paula A. Bradley
Attorney, Agent, or Firm—Sughrue, Mion, Zinn, Macpeak & Seas

[57] ABSTRACT

An electric connection box includes a pair of upper and lower cases connected together to provide a casing, one of the upper and lower cases having an electrically insulating housing. A wiring assembly is accommodated within the casing and includes an electrically insulating plate and a plurality of bus bars mounted on the insulating plate. External connection terminals are electrically connected to the bus bars and have respective contact portions received within the insulating housing. Each of the external connection terminals includes a base portion, a plurality of contact portions formed on one lateral edge of the base portion, and a bus bar-gripping portion formed on the other lateral edge of said base portion. The base portion is fixed to the case, with the contact portions extending into the housing. When the wiring assembly is covered or enclosed by the covers, the bus bar-gripping portion is press-fitted relative to the bus bar.

6 Claims, 5 Drawing Sheets

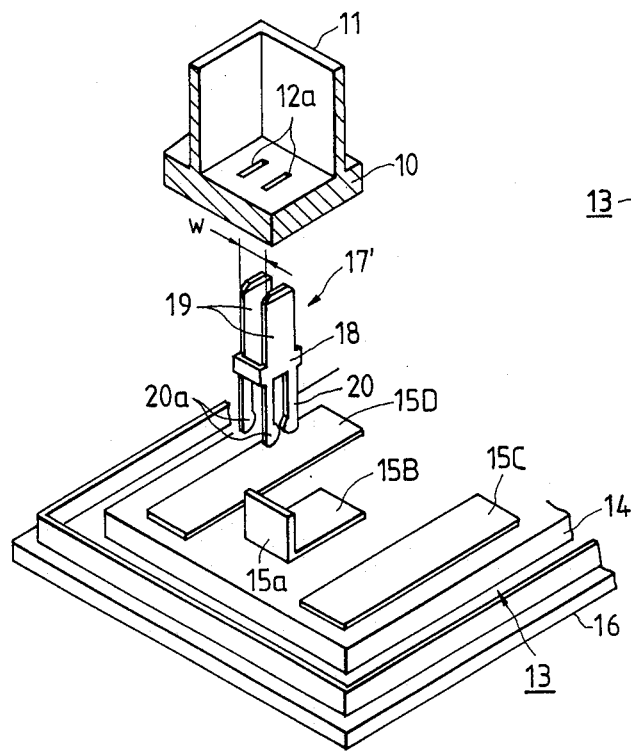
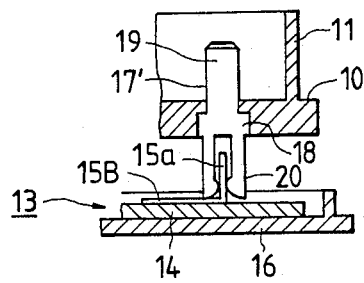
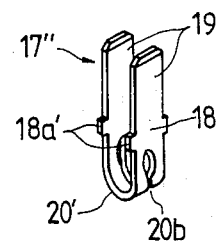

ELECTRIC CONNECTION BOX

BACKGROUND OF THE INVENTION

This invention relates generally to an electric connection box for automotive wiring and more particularly to such an electric connection box of the type in which bus bars constituting internal circuitry can be easily arranged and mounted in position.

Generally, as shown in FIG. 9, the internal circuitry of a conventional electric connection box is constituted by bus bars which are stamped from a metal sheet and have their end portions and/or intermediate portions thereof bent into upstanding tabs serving as terminals for external connection. However, as shown in FIG. 10, when providing two juxtaposed tabs 2A and 2A on a bus bar 1A interposed between two bus bars 1B and 1C, it is necessary to provide respective roundabout portions 1B' and 1C' in the adjacent bus bars in order to accommodate the portions 2A', which are the tabs 2A prior to bending. This lowers the yield of the stamping operation and the density of the mounting of the bus bars, and also makes the circuitry complicated.

To overcome this difficulty, there has been proposed an electric connection box as shown in FIG. 11. More specifically, a plurality of parallel bus bars 4 are mounted along respective edges thereof on a lower case 3; the lower case 3 also serving as an insulating plate. Branch bus bars 5 are mounted on the bus bars 4. A body 5a of each branch bus bar 5 is bent at one end 5b into an L-shape, and the other end portion 5c serves as a contact portion for connection to an external circuit. The L-shaped portion 5b of each branch bar 5 is fixedly secured to a respective one of the bus bars 4 by welding, such as spot welding, and then an upper case 6 is connected to the lower case 3, so that the contact portions 5c are received in position in various insulating housings, such as a connector housing 7a, a fuse cavity 7b and a relay cavity 7c, provided on the upper case 6.

Since the bus bars 4 and the branch bus bars 5 are fixedly connected together by welding, it is rather difficult to accurately position the contact portions 5c relative to one another and also relative to the above insulative housings. Particularly, when a plurality of branch bars 5 are fixedly connected to one bus bar 4, the overall shape of such bus bar arrangement becomes complicated, and if the order of the assemblage is wrong, the assemblage must be redone. This leads to low productivity.

SUMMARY OF THE INVENTION

It is therefore an object of this invention to provide an electric connection box in which the density of the bus bars is high, and terminals for connection to external circuits or devices can be easily mounted on the bus bars and arranged in position, thereby enhancing the productivity of the electric connection box.

According to the present invention, there is provided an electric connection box comprising a pair of upper and lower cases connected together to provide a casing, one of the upper and lower cases having an electrically insulating housing; a wiring assembly accommodated within the casing and including an electrically insulating plate and a plurality of bus bars mounted on the insulating plate; and external connection terminals electrically connected to the bus bars and having respective contact portions received within the insulating housing. Each of the external connection terminals includes a base portion fixed to one of the cases, a plurality of the contact portions formed on one lateral edge of the base portion and extending into the housing, and a bus bar-gripping portion formed on the other lateral edge of the base portion and press-fitted relative to the bus bar.

BRIEF DESCRIPTION OF THE DRAWINGS

FIG. 4 is a view similar to FIG. 1 but showing a modified electric connection box;

FIG. 5 is a fragmentary cross-sectional view of the electrical connection box of FIG. 4;

FIG. 6 is a perspective view of a modified external connection terminal:

DESCRIPTION OF THE PREFERRED EMBODIMENTS

Figure 1:
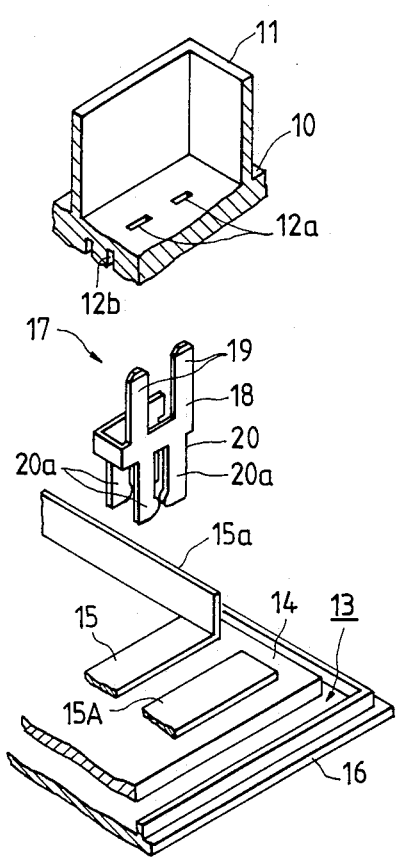
FIG. 1 is a fragmentary, partly-broken, exploded perspective view of an electric connection box provided in accordance with the present invention.

The invention will now be described with reference to the drawings in which like reference numerals denote corresponding parts in several views.

An electric connection box shown in FIG. 1 includes an upper cover 10 having an insulating housing 11 of a generally box-like shape. The upper cover 10 has a plurality of holes 12a formed through a bottom wall thereof, and a plurality of press-fitting grooves 12b formed in the underside of the bottom wall. A wiring assembly 13 comprises an electrically-insulating plate 14, and a plurality of bus bars 15, 15A . . . . Each bus bar 15 has at one end an integral bent plate portion 15a disposed vertically. The wiring assembly 13 is supported on a lower case 16 which is adapted to be connected to the upper case 10. The insulating plate 14 may be omitted, in which case the bus bars 15, 15A . . . are mounted directly on the lower case 16.

Reference numeral 17 denotes a terminal (hereinafter referred to as "external connection terminal") for connection to an external circuit or device. The external connection terminal 17 is formed from one metal sheet by stamping and bending. The terminal 17 includes a base portion 18, branch contact portions 19 extending from one lateral edge of the base portion 18, and a bus bar-gripping portion 20 (two portions 20 are shown in the illustrated embodiment) formed on the other lateral edge of the base portion 18. The branch contact portions 19 are in the form of tabs, and in this embodiment the number of the branch contact portions 19 is two, but this number may be more than two. The bus bar-gripping portion 20 comprises a pair of opposed holder sections 20a and 20a extending from the other lateral edge of the base portion 18, the pair of holder sections 20a and 20a having respective distal ends of a generally hook-shape disposed in opposed relation to each other. Preferably, the base portion 18 is formed into a U-shape, and a pair of bus bar-gripping portions 20 are formed on opposed arms of the U-shaped base portion 18 in opposed relation to each other.

Figure 2:
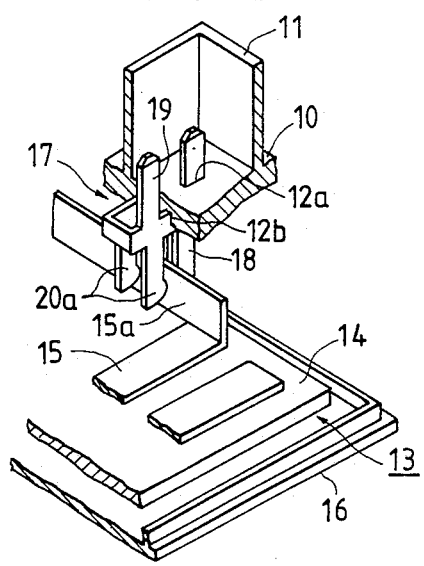
FIG. 2 is a fragmentary, partly-broken perspective view of the electric connection box.
Figure 3:
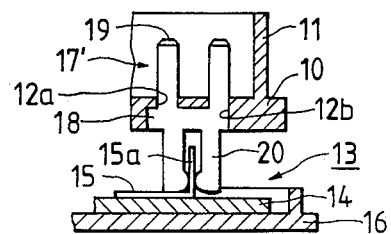
FIG. 3 is a fragmentary cross-sectional view of the electric connection box.

When the electric connection box is to be assembled as shown in FIGS. 2 and 3, the branch contact portions 19 of the external connection terminal 17 extend into the insulative housing 11 through the through holes 12a of the upper case 10, with the base portion 18 press-fitted in the press-fitting groove 12b to fix the external connection terminal 17 to the upper case 10. Then, when the upper case 10 with the external connection terminal 17 is placed on the wiring assembly 13, the vertical bent plate portion 15a of the bus bar 15 snugly fits between the two pairs of the holder sections 20a of the two bus bar-gripping portions 20, so that the holder sections 20a resiliently engage the vertical bent plate portion 15a, thereby making an electrical connection between the bus bar 15 and the external connection terminal 17. Then, the lower case 16 is connected to the upper case 10, thus completing the assemblage of the electric connection box. Alternatively, the wiring assembly 13 may be mounted on the lower case 16 before the external connection terminal 17 is connected to the bus bars 15.

FIGS. 4 and 5 show a modified form of the invention in which the pair of opposed branch contact portions 19 and 19 are formed respectively on opposed arms of the U-shaped base portion 18 of an external connection terminal 17'. In this embodiment, the distance w between the pair of opposed branch contact portions 19 and 19 is relatively small. Therefore, this construction is advantageous when a bus bar 15B, to which the external connection terminal 17' is to be connected, is disposed between two bus bars 15C and 15D in such a manner that the spaces on the opposite sides of the bus bar 15B are small.

FIG. 6 shows another modified external connection terminal 17''. The terminal 17'' includes a flat elongated body which is bent longitudinally into a U-shape, and opposed distal or free end portions thereof serve as a pair of branch contact portions 19 and 19, each in the form of a tab. A slot 20b is formed in the U-shaped end portion remote from the contact portions 19 and extends from a point near one base portion 18 to a point near the other base portion 18 to bifurcate the U-shaped end portion. This bifurcated portion serves as a bus bar-gripping portion 20'. The end portions 18a' of the base portions 18 are adapted to be press-fitted in the press-fitting grooves 12b.

Figure 7A:
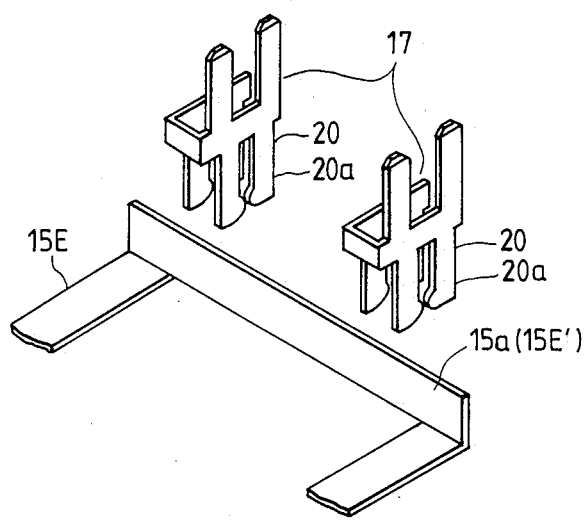
FIG. 7(a) is a perspective view showing one example of the arrangement of the external connection terminals of FIG. 1.
Figure 7B:
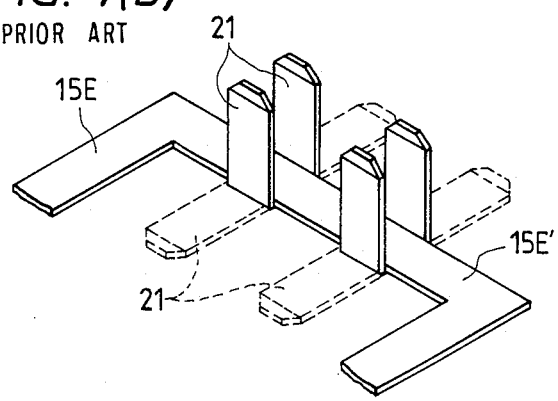
FIG. 7(b) is a perspective view of a conventional bus bar.

FIG. 7(a) shows another arrangement of the external connection terminals 17 of FIG. 1. One conventional bus bar 15E has four tabs 21 (external connection terminals) formed on opposites edges of a portion 15E' of the bus bar 15E (FIG. 7(b)). According to the present invention, the function of this conventional bus bar 15E can be obtained by bending a portion 15a (corresponding to the portion 15E' of FIG. 7(b), but having no tab 21) to provide a vertical bent plate portion and by connecting two external connection terminals 17 to the vertical bent plate portion 15a through the holder sections 20a press-fitted on the vertical bent plate portion 15a.

Figure 8:
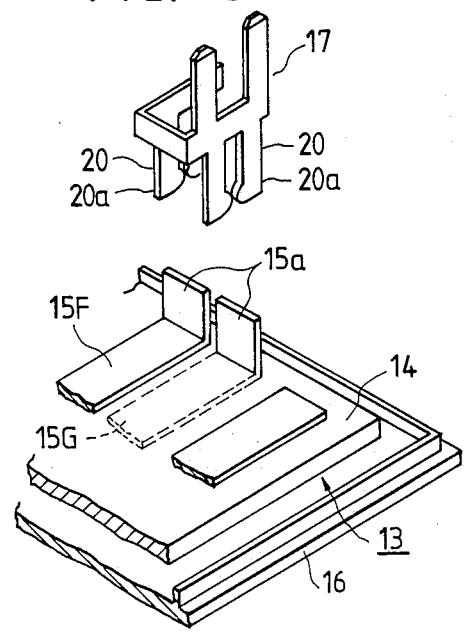
FIG. 8 is a perspective view showing another example of the arrangement of the external connection terminals of FIG 1.
Figure 9:
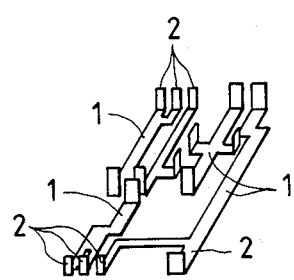
FIG. 9 is a perspective view of conventional bus bars.
Figure 10:
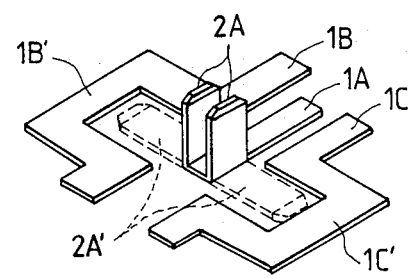
FIG. 10 is an enlarged perspective view of a portion of the conventional bus bars of FIG. 9.

FIG. 8 shows a further arrangement of the external connection terminal 17 of FIG. 1. In this case, one external connection terminal 17 is connected to vertical bent plate portions 15a and 15a of two bus bars 15F and 15G disposed respectively in first and second layers of the insulating plate 14, thereby making a short circuit between the two bus bars 15F and 15G. The two pairs of bus bar-gripping portions 20 and 20 are press-fitted, respectively, on the vertical bent plate portions 15a and 15a of the two bus bars 15F and 15G.

Figure 11:
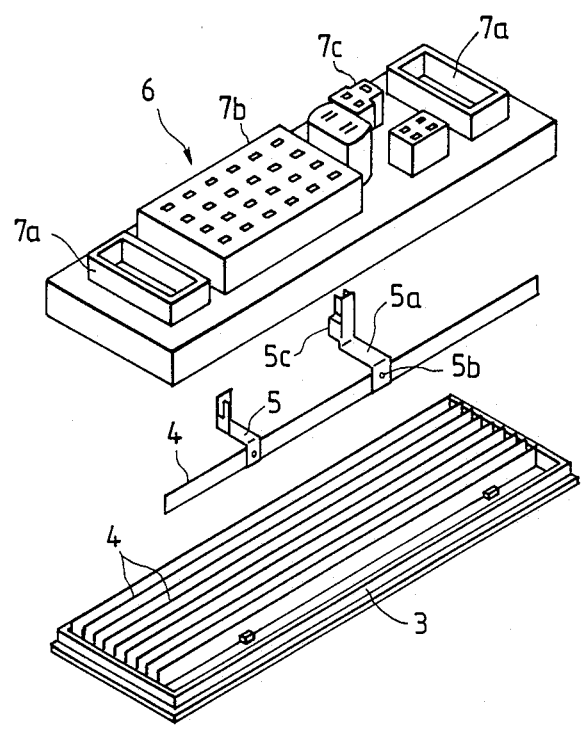
FIG. 11 is an exploded perspective view of a proposed electric connection box.

In the above embodiments, the external connection terminals 17, 17' and 17'' are press-fitted on the vertical bent plate portions 15a of the bus bars 15, 15A, 15B, etc., which are disposed flat relative to the insulating plate 14. However, if the external connection terminals 17, 17' and 17'' are to be connected to bus bars 4 disposed perpendicular to the insulative plate as shown in FIG. 11, the external connection terminals can be press-fitted directly on the bus bar bodies. Therefore, the wiring assembly 13 can be so constructed as to include a combination of the flat bus bars 15, 15A, 15B ... and perpendicular bus bars 4.

In the above embodiments, although the fixing of the external connection terminals to the case is made by the press-fitting method, this fixing can be made by a so-called case-lance method or a housing-lance method. In short, any fixing method can be used so long as the external connection terminals can be properly positioned beforehand.

As described above, in the present invention, the external connection terminal 17, 17', 17'' can be easily connected to the vertical bent plate portion 15a or the perpendicular bus bar 4 (FIG. 11) through the bus bar-gripping portions 20 press-fitted thereto. Moreover, the positioning of the external connection terminal can be easily made beforehand by press-fitting the base portion 18 in the press-fitting grooves 12b, which are formed in the upper case 10 or may be formed in the lower case 16.

Therefore, there is almost no need to provide the above-mentioned tabs 21 on the bus bars 15, 15A, 15B ... arranged flat relative to the insulative plate 14. This can simplify the construction of the circuitry constituted by the bus bars.

The simplified circuit construction of the bus bars improves the yield of stamping for forming the bus bars and also increases the density of the mounting of the bus bars. Further, the positioning and mounting of the external connection terminals can be made easily, thereby greatly improving the productivity of the electric connection box.

What is claimed is:

1. In an electric connection box of the type having a pair of upper and lower cases connected together to provide a casing, at least one of said upper and lower cases having an electrically insulating housing; a wiring assembly accommodated within said casing and including an electrically insulating plate and a plurality of bus bars mounted on said insulating plate; and external connection terminals electrically connected to said bus bars and having respective contact portions received within said insulating housing;

the improvement comprising, each of said external connection terminals including a base portion fixed to said one case, a plurality of said contact portions formed on one lateral edge of said base portion and extending into said housing, and a bus bar-griping portion formed on the other lateral edge of said base portion and press-fitted to a said bus bar, and wherein each bus bar includes a bent plate portion disposed substantially vertically for receiving said bus bar-gripping portion, in which said external connection terminal has two said bus bar-gripping portions press-fitted relative to at least one of said bus bars, respectively.

2. In an electric connection box of the type having a pair of upper and lower cases connected together to provide a casing, at least one of said upper and lower cases having an electrically insulating housing; a wiring assembly accommodated within said casing and including an electrically insulating plate and a plurality of bus bars mounted on said insulating plate; and external connection terminals electrically connected to said bus bars and having respective contact portions received within said insulating housing;

the improvement comprising, each of said external connection terminals including a base portion fixed to said one case, a plurality of said contact portions formed on one lateral edge of said base portion and extending into said housing, and a bus bar-gripping portion formed on the other lateral edge of said base portion and press-fitted to a said bus bar, and wherein each bus bar includes a bent plate portion disposed substantially vertically for receiving said bus bar-gripping portion, in which said base portion of said external connection terminal is of a generally U-shape having opposed arms, said bus bar-gripping portion comprising a pair of opposed holder sections formed on one of said opposed arm of said base portion, and said bus-bar being press-fitted in said pair of opposed holder sections.

3. In an electrical connection box of the type having a pair of upper and lower cases connected together to provide a casing, at least one of said upper and lower cases having an electrically insulating housing; a wiring assembly accommodated within said casing and including an electrically insulating plate and a plurality of bus bars mounted on said insulating plate; and external connection terminals electrically connected to said bus bars and having respective contact portions received within said insulating housing;

the improvement comprising, each of said external connection terminals including a base portion fixed to said one case, a plurality of said contact portions formed on one lateral edge of said base portion and extending into said housing, and a bus bar-gripping portion formed on the other lateral edge of said base portion and press-fitted to a said bus bar, and wherein each bus bar includes a bent plate portion disposed substantially vertically for receiving said bus-bar gripping portion, in which said base portion of said external connection terminal is of a generally U-shape having opposed arms, said bus bar-gripping portion comprising a pair of opposed holder sections formed on one of said opposed arm of said base portion, and said bus bar being press-fitted in said pair of opposed holder sections, and in which said external connection terminal has another bus bar-gripping portion comprising a pair of opposed holder sections formed on the other of said opposed arm of said base portion.

4. In an electric connection box of the type having a pair of upper and lower cases connected together to provide a casing, at least one of said upper and lower cases having an electrically insulating housing; a wiring assembly accommodated within said casing and including an electrically insulating plate and a plurality of bus bars mounted on said insulating plate; and external connection terminals electrically connected to said bus bars and having respective contact portions received within said insulating housing;

the improvement comprising, each of said external connection terminals including a base portion fixed to said one case, a plurality of said contact portions formed on one lateral edge of said base portion and extending into said housing, and a bus bar-gripping portion formed on the other lateral edge of said base portion and press-fitted to a said bus bar, and wherein each bus bar includes a bent plate portion disposed substantially vertically for receiving said bus bar-gripping portion, in which said base portion of said external connection terminal is of U-shape having opposed arms, said contact portions being formed on said opposed arms, and said external connection terminal having two said bus bar-gripping portions formed respectively on said opposed arms of said base portion.

5. In an electric connection box of the type having a pair of upper and lower cases connected together to provide a casing, at least one of said upper and lower cases having an electrically insulating housing; a wiring assembly accommodated within said casing and including an electrically insulating plate and a plurality of bus bars mounted on said insulating plate; and external connection terminals electrically connected to said bus bars and having respective contact portions received within said insulating housing;

the improvement comprising, each of said external connection terminals including a base portion fixed to said one case, a plurality of said contact portions formed on one lateral edge of said base portion and extending into said housing, and a bus bar-gripping portion formed on the other lateral edge of said base portion and press-fitted to a said bus bar, and wherein each bus bar includes a bent plate portion disposed substantially vertically for receiving said bus bar-gripping portion, in which said external connection terminal has a flat elongated body bent longitudinally into a U-shape having a pair of opposed arms, said U-shaped body having a pair of opposed free end portions and a U-shaped portion at the other end thereof, said free end portions serving respectively as said contact portions, a central section of each of said opposed arms serving as said base portion, a slot being formed in said U-shaped end portion and extending from a point near one of said base portions to a point near the other base portion to bifurcate the U-shaped end portion, said bifurcated portion serving as said bus-bar gripping portion.

6. In an electric connection box of the type having a pair of upper and lower cases connected together to provide a casing, at least one of said upper and lower cases having an electrically insulating housing; a wiring assembly accommodated within said casing and including an electrically insulating plate and a plurality of bus bars mounted on said insulating plate; and external connection terminals electrically connected to said bus bars and having respective contact portions received within said insulating housing;

the improvement comprising, each of said external connection terminals including a base portion fixed to said one case, a plurality of said contact portions formed on one lateral edge of said base portion and extending into said housing, and a bus bar-gripping portion formed on the other lateral edge of said base portion and press-fitted to a said bus bar, and wherein each bus bar includes a bent plate portion disposed substantially vertically for receiving said bus bar-gripping portion, in which said housing has a plurality of holes formed through a wall thereof, said contact portions extending respectively through said holes into said housing, said housing having a groove formed in the wall thereof, and said base portion of said external connection terminal being press-fitted in said groove.

* * * * *